(12) United States Patent
Anzai et al.

(10) Patent No.: US 6,674,645 B2
(45) Date of Patent: Jan. 6, 2004

(54) HIGH FREQUENCY SIGNAL SWITCHING UNIT

(75) Inventors: Tsunehiro Anzai, Osaka (JP); Kazuhiko Inoue, Osaka (JP); Masakazu Nishikawa, Osaka (JP); Kazuhisa Fujii, Osaka (JP)

(73) Assignee: Matsushita Electric Works, Ltd., Osaka (JP)

( * ) Notice: Subject to any disclaimer, the term of this patent is extended or adjusted under 35 U.S.C. 154(b) by 0 days.

(21) Appl. No.: 09/863,260

(22) Filed: May 24, 2001

(65) Prior Publication Data

US 2002/0004321 A1 Jan. 10, 2002

(30) Foreign Application Priority Data

May 26, 2000 (JP) .................................. 2000-157256

(51) Int. Cl.⁷ ........................... H05K 5/00; H05K 1/18
(52) U.S. Cl. .................. 361/752; 361/760; 361/819; 361/736; 174/50
(58) Field of Search ................ 361/736, 739, 361/752–53, 760, 761, 776, 784, 819; 174/50; 257/678; 455/8

(56) References Cited

U.S. PATENT DOCUMENTS

| | | | |
|---|---|---|---|
| 4,703,394 A | 10/1987 | Petit et al. | |
| 4,808,114 A | 2/1989 | Mohri et al. | |
| 5,517,747 A * | 5/1996 | Pierro et al. | 29/600 |
| 5,828,555 A * | 10/1998 | Itoh | 361/784 |
| 5,903,829 A * | 5/1999 | Anderson et al. | 455/347 |
| 6,049,709 A | 4/2000 | Anderson et al. | |
| 6,159,586 A * | 12/2000 | Inuoue et al. | 428/209 |
| 6,252,176 B1 * | 6/2001 | Kuramochi et al. | 174/255 |
| 6,313,995 B1 * | 11/2001 | Koide et al. | 361/705 |
| 6,373,710 B1 * | 4/2002 | Suzuki | 361/752 |

FOREIGN PATENT DOCUMENTS

| | | |
|---|---|---|
| JP | 8-8619 | 1/1996 |
| JP | 9-45204 | 2/1997 |

* cited by examiner

Primary Examiner—David Martin
Assistant Examiner—Dameon E. Levi
(74) Attorney, Agent, or Firm—Greenblum & Bernstein, P.L.C.

(57) ABSTRACT

A high frequency signal switching unit includes a printed circuit board accommodated in the casing and having a ground layer formed on substantially one entire surface thereof. Input and output terminals are mounted on the casing, and a high frequency relay is mounted on the printed circuit board for switching between the input terminal and the output terminal. The high frequency relay has a plurality of relay contact terminals and a grounding terminal. A plurality of coaxial cables having respective internal and external conductors connect the input and output terminals to the relay contact terminals. The grounding terminal of the high frequency relay and the external conductors of the coaxial cables are connected to the ground layer of the printed circuit board, while each of the internal conductors of the coaxial cables is connected to one of the relay contact terminals of the high frequency relay.

21 Claims, 7 Drawing Sheets

HIGH FREQUENCY SIGNAL SWITCHING UNIT

BACKGROUND OF THE INVENTION

1. Field of the Invention

The present invention relates to a high frequency signal switching unit for switching a plurality of output terminals to selectively output therefrom a high frequency signal inputted from an input terminal or for switching between at least one input terminal and at least one output terminal.

2. Description of the Related Art

FIG. 17 depicts a conventional high frequency signal switching unit (known as the coaxial switch or high frequency unit) that includes three high frequency relays 10 fixed within a generally box-shaped metallic casing 1 by means of a conductive adhesive. The high frequency relays 10 are connected at their relay contact terminals 11 to five coaxial connectors 3 mounted on a side wall of the metallic casing 1 by coaxial cables 30, and also connected at their coil terminals 12 to a relay connector 40 mounted on another side wall of the metallic casing 1 by lead wires 41. The central coaxial connector 3 is an input terminal into which a high frequency signal is inputted, while other four coaxial connectors 3 are output terminals from which the high frequency signal is selectively outputted.

Each high frequency relay 10 is provided with a shielding plate 4 disposed around the relay contact terminals 11. Each coaxial cable 30 includes an internal conductor (core) 31 connected to one of the relay contact terminals 11 by soldering, and also includes an external conductor (in the case of the illustrated coaxial cable 30, the whole sheath is the external conductor) 32 joined to the shielding plate 4, which is in turn grounded. The shielding plate 4 is provided with chip capacitors C mounted thereon for absorbing high frequency signals that leak from the coaxial cables 30 to the lead wires 41.

By the above-described construction, the high frequency relays 10 are supplied with electricity via the relay connector 40 so that the high frequency signal inputted from one of the coaxial connectors 3 forming the input terminal may be selectively outputted from any one of the remaining four coaxial connectors 3.

In the conventional high frequency signal switching unit of the above-described construction, because the high frequency relays 10 are fixed to the metallic casing 1 by means of the conductive material, the positions of the high frequency relays 10 are not always fixed. Furthermore, because the coaxial cables 30 are supported by only the opposite connecting portions, a difficulty is encountered in positioning and temporarily fixing the coaxial cables 30 during assembling, thus lowering the working efficiency and increasing variation in the product characteristics. Also, shielding is not performed between the relay contact terminals 11 of the neighboring high frequency relays 10, thus deteriorating the insulation properties (high frequency characteristics).

SUMMARY OF THE INVENTION

The present invention has been developed to overcome the above-described disadvantages.

It is accordingly an objective of the present invention to provide a high frequency signal switching unit having improved high frequency characteristics, wherein the positions of the high frequency relays are fixed, and the coaxial cables can be readily positioned and temporarily fixed.

In accomplishing the above and other objectives, the high frequency signal switching unit according to the present invention includes a casing and a printed circuit board accommodated in the casing and having a first surface and a second surface opposite to each other. The printed circuit board also has a ground layer formed on substantially the entire first surface. The high frequency signal switching unit also includes at least one input terminal and at least one output terminal both mounted on the casing, and at least one high frequency relay mounted on the printed circuit board for switching between the input terminal and the output terminal so that a high frequency signal inputted into the input terminal is selectively outputted from the output terminal. The high frequency relay has a plurality of relay contact terminals and a grounding terminal. A plurality of coaxial cables having respective internal and external conductors are accommodated in the casing to connect the input and output terminals to the relay contact terminals of the high frequency relay. The grounding terminal of the high frequency relay and the external conductors of the coaxial cables are connected to the ground layer of the printed circuit board, while each of the internal conductors of the coaxial cables is connected to one of the relay contact terminals of the high frequency relay.

With this arrangement, because the high frequency relay is secured to the printed circuit board, the position thereof is fixed. Accordingly, the positioning and temporary fixing of the coaxial cables within the casing can be readily carried out. Furthermore, the grounding terminal of the high frequency relay and the external conductors of the coaxial cables are all connected to the ground layer of the printed circuit board, making it possible to improve the high frequency characteristics.

The printed circuit board has a plurality of recesses defined therein in which end portions of the coaxial cables are respectively received. This arrangement further facilitates the positioning of the coaxial cables relative to the printed circuit board.

Preferably, the external conductors have a diameter substantially equal to a width of the recesses. With this configuration, when the coaxial cables are inserted into respective recesses, the former are temporarily fixed. Accordingly, the distance between the relay contact terminals of the high frequency relay and the internal conductors of the associated coaxial cables is made substantially constant, thus stabilizing the high frequency characteristics.

The recesses are elongated in the axial directions of the coaxial cables. By so doing, the temporary fixing of the coaxial cables relative to the printed circuit board can be readily carried out, making it possible to enhance the working efficiency during assemblage of the coaxial cables.

The depth of the recesses is determined such that the internal conductors are aligned with the second surface of the printed circuit board. By so doing, the distance between the relay contact terminals of the high frequency relay and the internal conductors of the associated coaxial cables can be reduced, enhancing the high frequency characteristics.

The printed circuit board has a plurality of grooves defined therein so as to extend across a thickness thereof, in which end portions of the coaxial cables are respectively received. Because the formation of the grooves in the printed circuit board is relatively easy, the manufacturing cost of the high frequency signal switching unit can be reduced.

Advantageously, each of the grooves has an electrically conductive layer formed on an inner wall thereof, which is connected to the ground layer of the printed circuit board.

The formation of the electrically conductive layer increases the contact area and connecting strength of the coaxial cables. Furthermore, the external conductors of the coaxial cables and the ground layer of the printed circuit board are connected at a reduced distance, resulting in an increase in ground strength and ensuring more reliable grounding.

Again advantageously, the printed circuit board has a plurality of through-holes defined therein, each of which communicates with a neighboring one of the grooves to accommodate one of the relay contact terminals of the high frequency relay. Each of the through-holes has an electrically conductive layer formed on an inner wall thereof, which is connected to the ground layer of the printed circuit board. The electrically conductive layer acts to shield the relay contact terminals, making it possible to enhance the insulation properties.

Conveniently, each of the internal conductors has a planar free end and a through-hole defined therein, into which one of the relay contact terminals is inserted. This configuration facilitates the assembling work and enhances the connecting strength between the internal conductors and the relay contact terminals.

The printed circuit board may be of a multi-layered construction having two layers formed one upon another with strip lines made of an electrically conductive material interposed therebetween. The strip lines are intended to connect the relay contact terminals of the high frequency relay to the internal conductors of the coaxial cables. In this case, the printed circuit board also has two ground layers formed on external surfaces of the two layers, respectively. By this construction, the positions of the coaxial cables and those of the relay contact terminals relative to the printed circuit board can be changed while suppressing the insertion loss as small as possible. Accordingly, the lengths of the coaxial cables can be made substantially constant, making it possible to reduce the manufacturing cost thereof.

The high frequency signal switching unit further includes a relay connector mounted on the casing for supplying the high frequency relay with electricity, wherein the high frequency relay has coil terminals, and the printed circuit board has a wiring pattern formed in the ground layer for connecting the relay connector to the coil terminals. The formation of the wiring pattern can reduce the number of the component parts and the size of the high frequency signal switching unit, compared with the case wherein the relay connector and the coil terminals are connected via lead wires.

Advantageously, the printed circuit board has a plurality of grooves defined therein so as to extend across a thickness thereof, in which end portions of the coaxial cables are respectively received. Each of the grooves has an electrically conductive layer formed on an inner wall thereof, which is connected to the two ground layers of the printed circuit board. With this arrangement, the two ground layers of the printed circuit board and the external conductors of the coaxial cables are all connected together via the electrically conductive layers, making it possible to further improve the high frequency characteristics.

It is preferred that the printed circuit board be made of a fluorine-contained resin. Because the fluorine-contained resin has a small dielectric dissipation factor, not only can the printed circuit board be made thin, but the insertion loss can also be reduced.

Advantageously, the printed circuit board has a plurality of recesses defined therein on one side thereof where connecting portions between the internal conductors of the coaxial cables and the strip lines are exposed. With this arrangement, the internal conductors of the coaxial cables can be connected directly to the strip lines and, hence, the insertion loss can be reduced. Also, the shielding between the neighboring strip lines can be achieved.

The high frequency signal switching unit further includes a conductor connected to the two ground layers of the printed circuit board, wherein the recesses of the printed circuit board are closed by the conductor. The conductor acts to enhance the shielding properties.

The conductor may be a ground layer formed on substantially one entire surface of another printed circuit board and connected to the two ground layers of the printed circuit board. The ground layer acts to enhance the shielding properties. In this case, if a component part adjacent to the strip lines is an insulator (substrate), short-circuiting can be prevented.

The high frequency signal switching further includes a relay connector mounted on the casing for supplying the high frequency relay with electricity, wherein the high frequency relay has coil terminals, and the another printed circuit board has a wiring pattern formed in the ground layer for connecting the relay connector to the coil terminals. With this arrangement, the possibility of high frequency signals jumping from the strip lines of the multi-layered printed circuit board to the wiring pattern for connecting the relay connector and the coil terminals of the high frequency relay is reduced. As a result, capacitors that have been hitherto used to absorb leakage of the high frequency signals can be dispensed with, making it possible to reduce the number of the component parts and the manufacturing cost.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

This application is based on an application No. 2000-157256 filed May 26, 2000 in Japan, the content of which is, herein expressly incorporated by reference in its entirety.

The term "grounding terminal" as employed throughout this application is defined as a terminal required to obtain high frequency matching, which creates a specific impedance to provide required high frequency characteristics.

Figure 1:
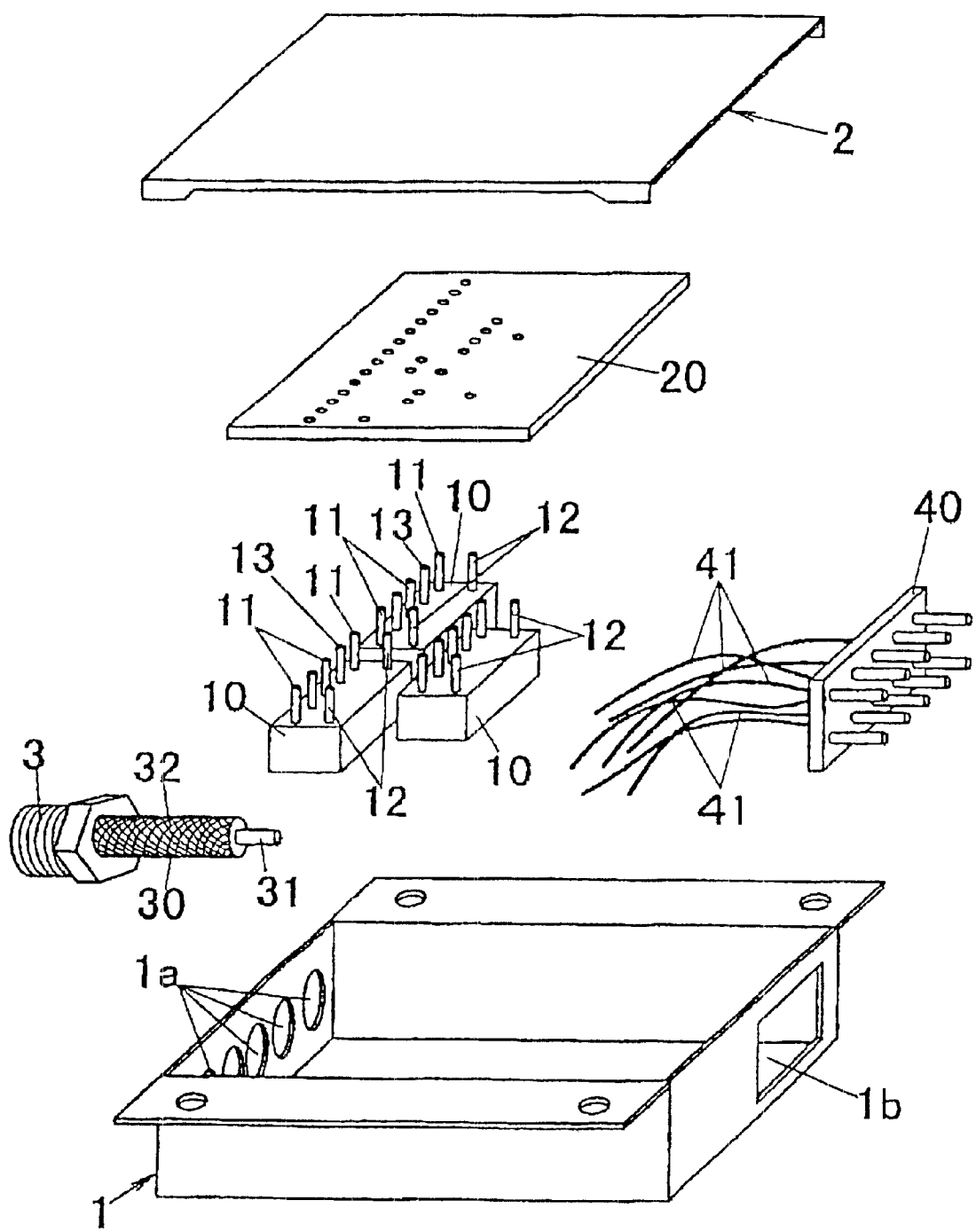
FIG. 1 is an exploded perspective view of a high frequency signal switching unit according to a first embodiment of the present invention.

Referring now to the drawings, there is shown in FIG. 1 a high frequency signal switching unit according to a first embodiment of the present invention. The high frequency signal switching unit shown therein includes a generally box-shaped metallic casing 1 having four side walls, a top wall (a lower wall in the illustrated embodiment), and a bottom opening. One of the side walls has five generally round holes 1a defined therein in a side-by-side fashion, while another side wall opposite thereto has a generally rectangular hole 1b defined therein. A coaxial connector 3 forming an input terminal or an output terminal is mounted in each round hole 1a, and a relay connector 40 through which signals for controlling the high frequency relays 10 are inputted is mounted in the rectangular hole 1b. The metallic casing 1 accommodates a printed circuit board 20 secured thereto on which a plurality of (for example, three) high frequency relays 10 are mounted. The bottom opening of the metallic casing 1 is tightly closed by a planar metallic bottom cover 2.

Each high frequency relay 10 is a mechanical relay having a metallic casing in which relay contacts, a coil and the like are accommodated and through which relay contact terminals 11 leading to the relay contacts (switching contacts in this embodiment), coil terminals 12 for supplying electricity to drive the coil, and a grounding terminal 13 extend outwardly. This mechanical relay is superior in high frequency characteristics such, for example, as isolation or insertion loss, the voltage standing wave ratio (VSWR), or the like.

Figure 2:
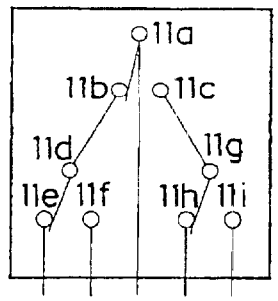
FIG. 2 is a switching circuit diagram of the high frequency signal switching unit of FIG. 1.

FIG. 2 schematically depicts the relay contact terminals 11 of the three high frequency relays 10 accommodated in the metallic casing 1. As shown therein, the first high frequency relay 10 includes three relay contact terminals 11a, 11b and 11c, the second high frequency relay 10 includes three relay contact terminals 11d, 11e and 11f, and the third high frequency relay 10 includes three relay contact terminals 11g, 11h and 11i. The wiring pattern connects the relay contact terminal 11b of the first high frequency relay 10 to the relay contact terminal 11d of the second high frequency relay 10, and also connects the relay contact terminal 11c of the first high frequency relay 10 to the relay contact terminal 11g of the third high frequency relay 10. In place of the wiring pattern, a plurality of (in this case, two) cables may be used to connect the associated relay contact terminals to each other. In the illustrated embodiment, the high frequency signal switching unit switches between one input terminal and four output terminals.

Discussion and Illustration of the construction of the high frequency relay 10 is omitted, because it is well known.

The coaxial connector 3 is a high frequency one that has a threaded connecting portion and a coaxial cable 30 having an internal conductor (core) 31 and an exposed external conductor 32 in which the internal conductor 31 is accommodated. The whole sheath, made of knitted wires, forms the external conductor 32.

Figure 3:
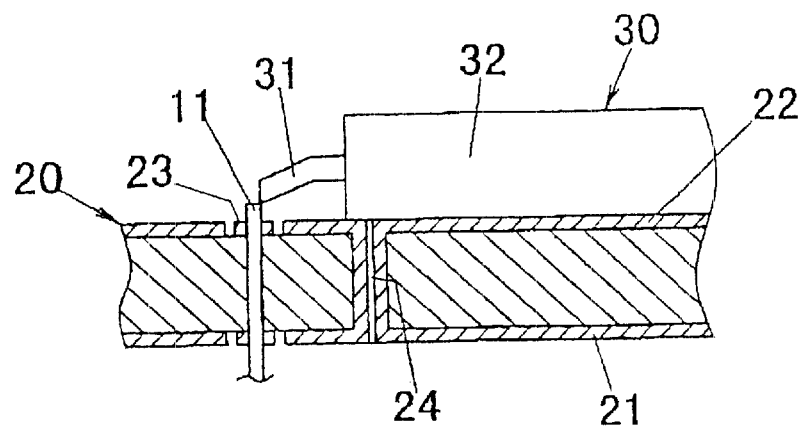
FIG. 3 is a partial vertical sectional view of a principal portion of the high frequency signal switching unit of FIG. 1.

As shown in FIG. 3, the printed circuit board 20 has a ground layer 21 formed over substantially the entire rear face thereof, and also has a wiring pattern (not shown) for use in connecting the associated relay contact terminals 11 of the high frequency relays 10, a wiring pattern (not shown) for use in connecting the lead wires (power lines) 41 connected to the relay connector 40 to the coil terminals 12 of the high frequency relays 10, an electrically conductive pattern 22 connected to the external conductors 32 of the coaxial cables 30, and land portions 23 connected to those relay contact terminals 11 of the high frequency relays 10 that protrude from a front face of the printed circuit board 20, all of which are formed on the front face of the printed circuit board 20. The electrically conductive pattern 22 is connected to the ground layer 21 formed on the rear face of the printed circuit board 20 via through-holes 24. As discussed previously, the wiring pattern for connecting the associated relay contact terminals 11 of the high frequency relays 10 may be replaced by a plurality of cables or any other suitable means.

As best shown in FIG. 3, an end portion of each coaxial cable 30 is placed on the electrically conductive pattern 22 of the printed circuit board 20 so that the internal conductor 31 may be positioned in close proximity to the associated one of the relay contact terminals 11. Thereafter, the external conductor 32 of the end portion is electrically connected to the electrically conductive pattern 22, while the internal conductor 31 is electrically connected to the associated relay contact terminal 11, for example, by soldering. Although not shown in the drawings, the grounding terminals 13 of the high frequency relays 10 are electrically connected to the ground layer 21 of the printed circuit board 20 either directly or via respective through-holes.

Figure 17:
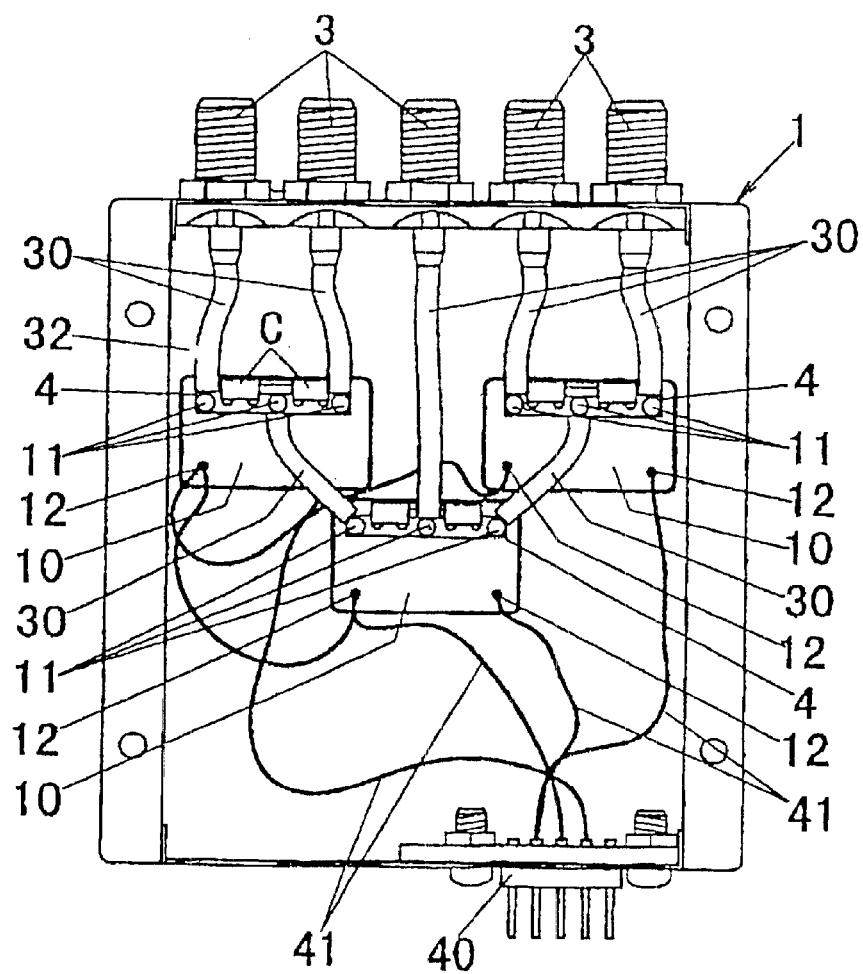
FIG. 17 is a bottom plan view of a conventional high frequency signal switching unit with a bottom cover removed.

As described above, the grounding terminals 13 of the high frequency relays 10 and the external conductors 32 of the coaxial cables 30 are connected to the ground layer 21 of the printed circuit board 20, while the internal conductors 31 of the coaxial cables 30 are connected to the relay contact terminals 11 of the high frequency relays 10. That is, all the high frequency relays 10 are secured to the printed circuit board 20 and, hence, the positions of the high frequency relays 10 are fixed, unlike the conventional high frequency signal switching unit shown in FIG. 17. Accordingly, the positioning and temporary fixing of the coaxial cables 30 within the metallic casing 1 can be readily carried out, thus facilitating the assembling work. Furthermore, the grounding terminals 13 of the high frequency relays 10 and the external conductors 32 of the coaxial cables 30 are all connected to the same ground layer 21 of the printed circuit board 20. Because the ground is integrated in this manner, the high frequency characteristics are improved. If a fluorine-contained resin having a small dielectric dissipation factor such, for example, as a polymer of ethylene tetrafluoride (trade name: Teflon) is used for the substrate of the printed circuit board 20, not only can the printed circuit board 20 be made thin, but the insertion loss can also be reduced.

Figure 4:
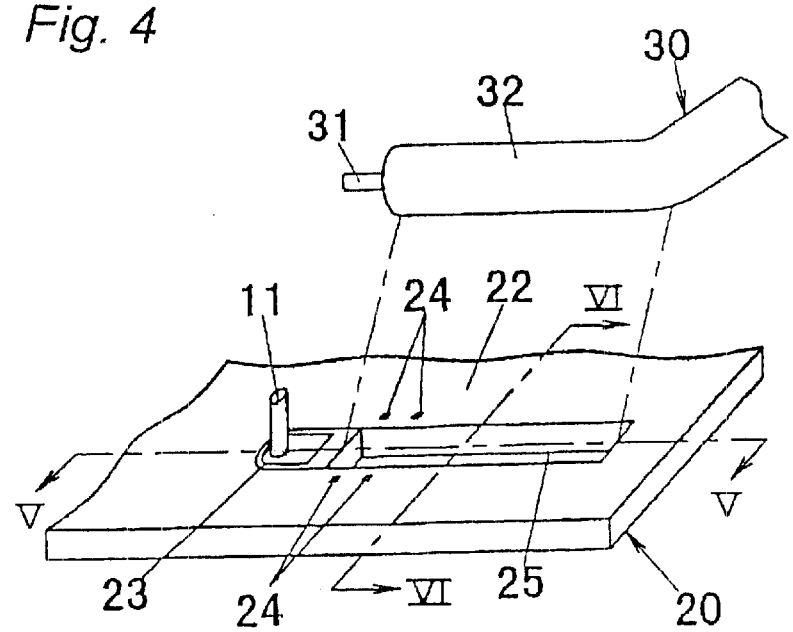
FIG. 4 is an exploded perspective view of the principal portion of FIG. 3, but depicting a modification thereof.
Figure 5:
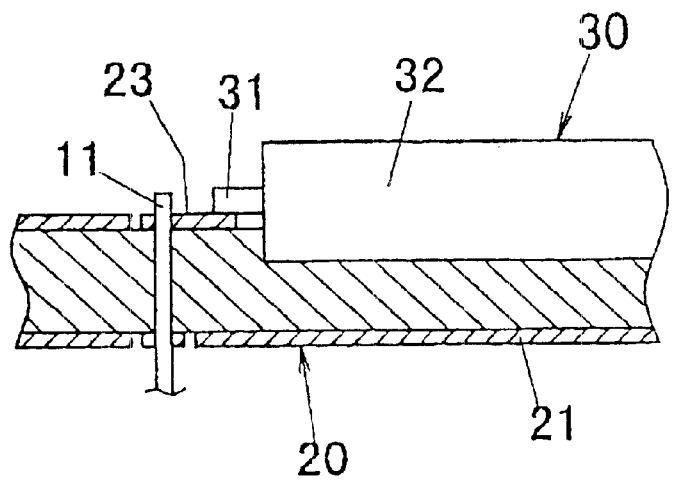
FIG. 5 is a Sectional view taken along line V—V in FIG. 4.
Figure 6:
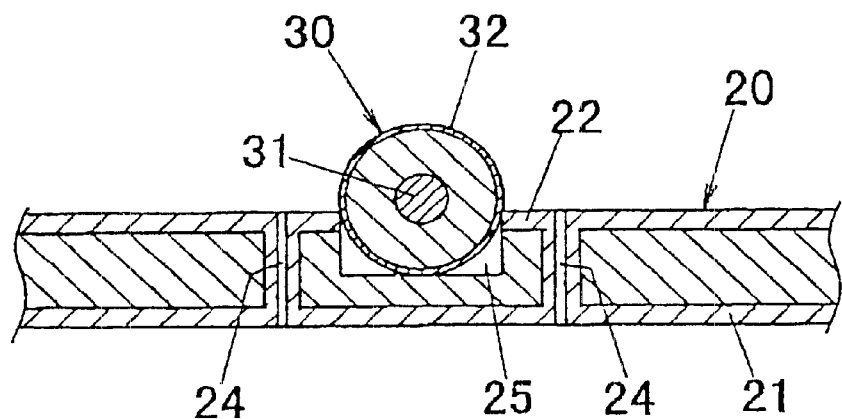
FIG. 6 is a sectional view taken along line VI—VI in FIG. 4.

As shown in FIGS. 4 to 6, the printed circuit board 20 may have a plurality of elongated recesses 25 (only one is shown) defined in the front face thereof, each of which is intended to receive the end portion of one of the coaxial cables 30. Each elongated recess 25 has a short side adjacent to the land portion 23 and extends in the axial direction of the associated coaxial cable 30. The elongated recess 25 has a width substantially equal to the diameter of the external conductor 32, and the depth thereof is determined such that the internal conductor 31 of the coaxial cable 30 is aligned with the front face of the printed circuit board 20.

Because the end portion of each coaxial cable 30 is received in the associated elongated recess 25 in the printed circuit board 20, the positioning of the coaxial cable 30 relative to the printed circuit board 20 is further facilitated. Also, because the width of the elongated recess 25 is substantially equal to the diameter of the external conductor 32, the end portion of the coaxial cable 30 is fast held by opposite inner side walls of the elongated recess 25 and, hence, it is unlikely that the coaxial cable 30 received in the elongated recess 25 moves laterally. Accordingly, the distance between the relay contact terminal 11 of the high frequency relay 10 and the internal conductor 31 of the coaxial cable 30 is kept substantially constant, making it possible to stabilize the high frequency characteristics. Moreover, because the recess 25 is elongated in the axial direction of the coaxial cable 30, the temporary fixing of the coaxial cable 30 relative to the printed circuit board 20 can be readily carried out, thus enhancing the working efficiency during assemblage of the coaxial cable 30.

In addition, because the depth of the elongated recess 25 is so determined that the internal conductor 31 of the coaxial cable 30 is aligned with the front face of the printed circuit board 20, the internal conductor 31 of the coaxial cable 30 is placed on the front face of the printed circuit board 20 under the condition in which the coaxial cable 30 is appropriately received within the elongated recess 25, as shown in FIG. 5. As a result, the free end of the internal conductor 31 is positioned adjacent to the relay contact terminal 11, thus improving the high frequency characteristics.

Figure 7:
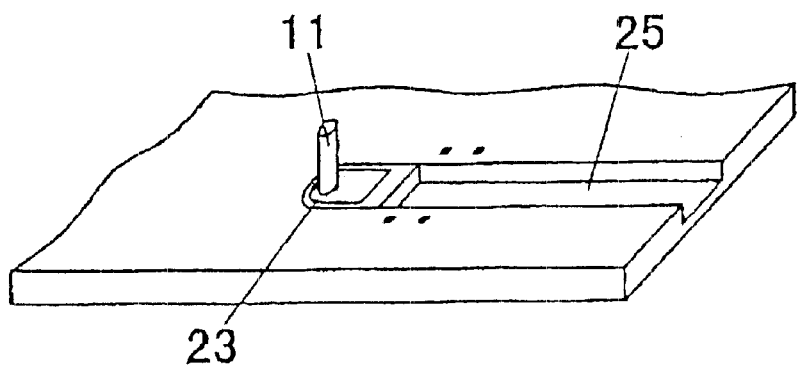
FIG. 7 is a view similar to FIG. 4, but depicting another modification thereof.

As shown in FIG. 7, the elongated recess 25 may be so formed as to extend to an edge of the printed circuit board 20 to have an open end. By so doing, it is possible to positively hold the coaxial cable 30 within the elongated recess 25.

Figure 8:
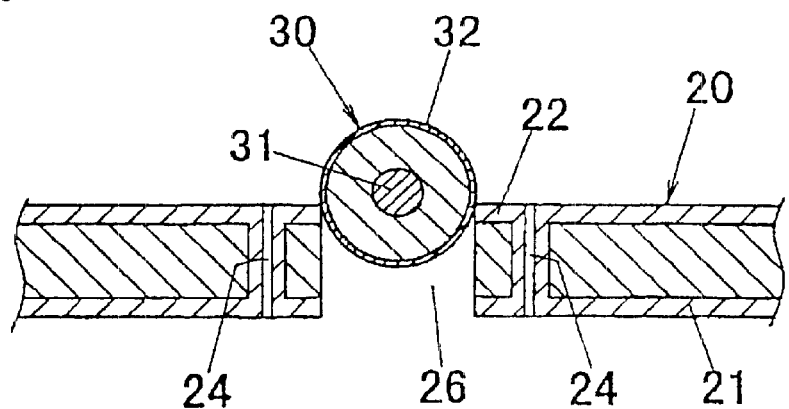
FIG. 8 is a view similar to FIG. 6, but depicting a further modification thereof.

FIG. 8 depicts the case wherein the printed circuit board 20 has a plurality of grooves 26 (only one is shown), in place of the elongated recesses 25, each for receiving the end portion of one of the coaxial cables 30. Each groove 26 extends across the thickness of the printed circuit board 20 and has no bottom wall, unlike the elongated recess 25.

Compared with the elongated recess 25 shown in FIGS. 4 to 7, the formation of the groove 26 extending across the thickness of the printed circuit board 20 is relatively easy, making it possible to reduce the manufacturing cost of the printed circuit board 20.

Figure 9:
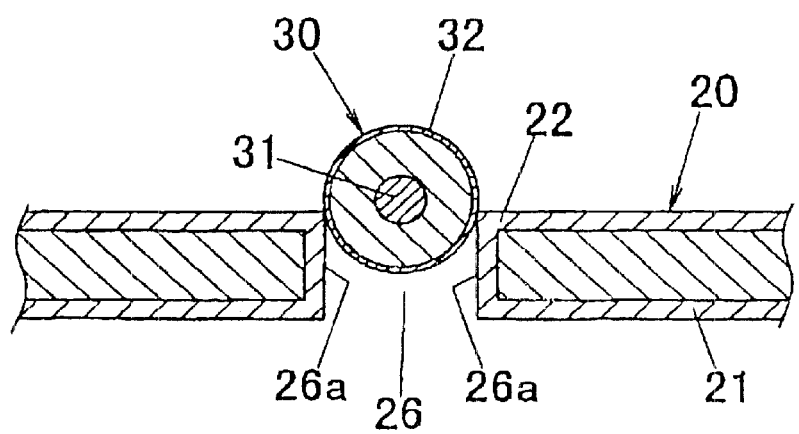
FIG. 9 is a view similar to FIG. 6, but depicting a still further modification thereof.

As shown in FIG. 9, the printed circuit board 20 may have electrically conductive layers 26a formed on the inner side walls of each groove 26. The electrically conductive layers 26a are formed by plating the inner side walls of the groove 26 with solder so that the ground layer 21 and the electrically conductive pattern 22 formed on the opposite faces of the printed circuit board 20 may be connected to each other via the electrically conductive layers 26a.

The formation of the electrically conductive layers 26a increases the contact area of the coaxial cables 30, resulting in an increase in the connecting strength. Also, because the ground layer 21 and the electrically conductive pattern 22 are connected to each other via the electrically conductive layers 26a and not via the through-holes, the external conductors 32 of the coaxial cables 30 are connected to the ground layer 21 at a reduced distance, making it possible to increase the strength of the ground.

Figure 10:
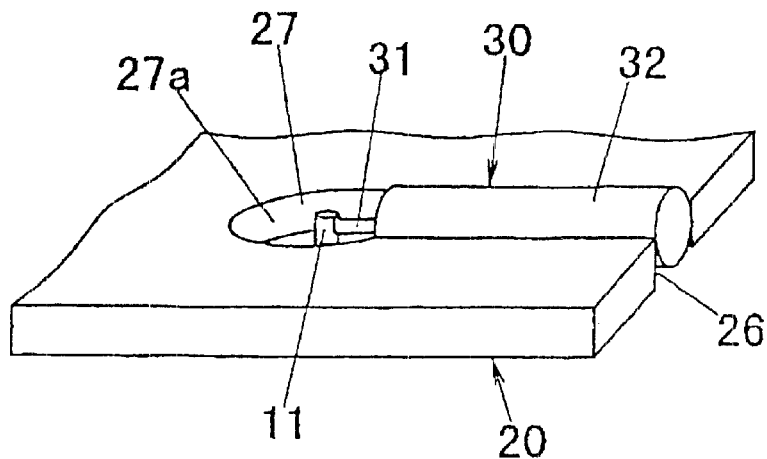
FIG. 10 is a view similar to FIG. 4, but depicting another modification thereof.

As shown in FIG. 10, the printed circuit board 20 may have a plurality of through-holes 27 (only one is shown), each of which communicates with the neighboring groove 26 to accommodate one of the relay contact terminals 11 of the high frequency relays 10. Each through-hole 27 has an electrically conductive layer 27a formed on the inner side wall thereof so as to communicate with the ground layer 21 of the printed circuit board 20. The electrically conductive layer 27a is formed by plating the inner side wall of the through-hole 27 with solder so that the electrically conductive layer 27 may be connected to the ground layer 21 on the rear face of the printed circuit board 20.

Because the electrically conductive layer 27a acts to shield the relay contact terminal 11, the insulation properties are enhanced. It is preferred that the free end of the relay contact terminal 11 be cut at a position lower than the thickness of the printed circuit board 20 so that the relay contact terminal 11 may not serve as an antenna that radiates noise.

Figure 11:
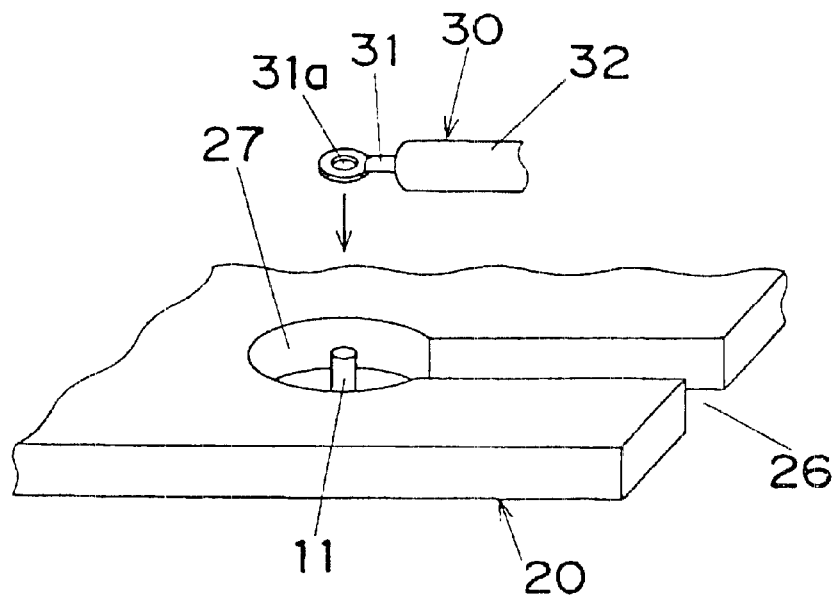
FIG. 11 is a view similar to FIG. 4 but depicting a further modification thereof.

As shown in FIG. 11, the internal conductor 31 of each coaxial cable 30 may have a planar free end and a generally round through-hole 31a defined therein. With this configuration, the relay contact terminal 11 is first inserted into the generally round through-hole 31a and subsequently jointed to the internal conductor 31, making it possible to enhance the connecting strength between the relay contact terminal 11 and the internal conductor 31.

Figure 12:
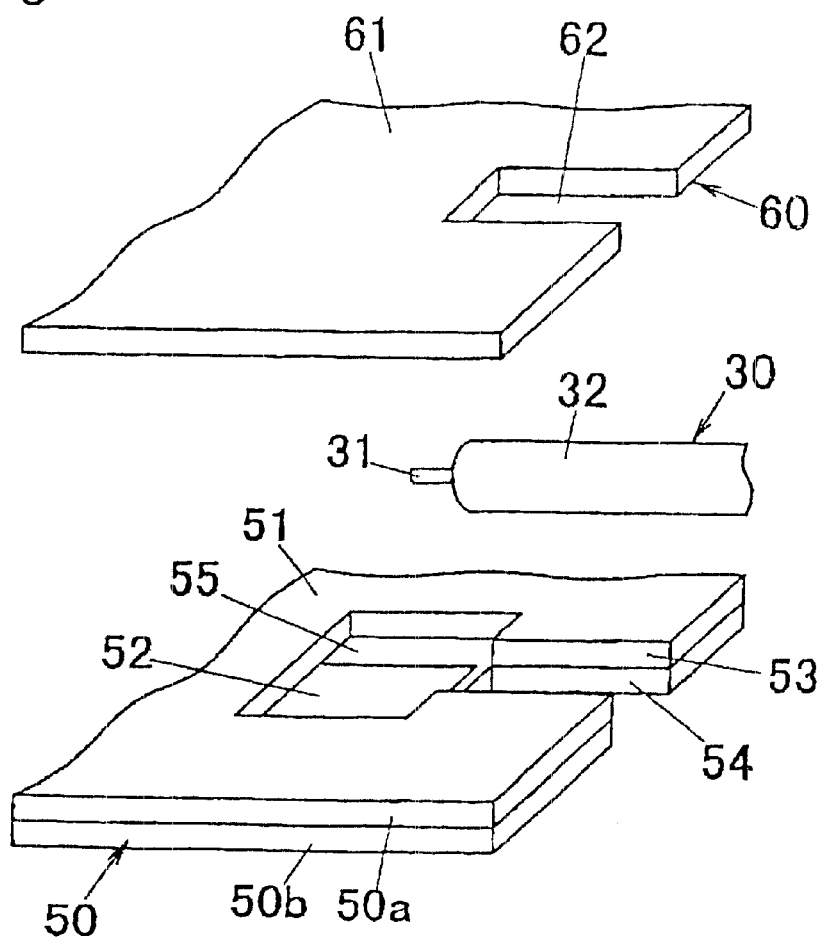
FIG. 12 is an exploded perspective view of a principal portion of a high frequency signal switching unit according to a second embodiment of the present invention.
Figure 13:
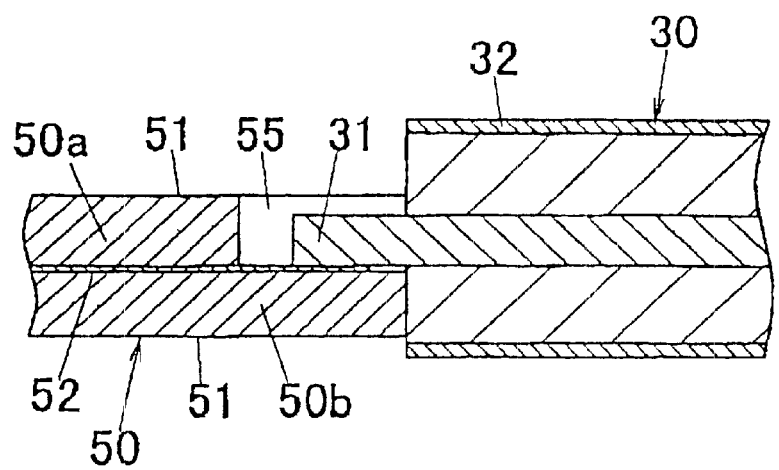
FIG. 13 is a vertical sectional view of the principal portion of FIG. 12.

As shown in FIGS. 12 and 13, the printed circuit board 50 may be a multi-layered one having a strip line construction. The printed circuit board 50 shown therein has two insulation layers 50a, 50b formed one upon the other with strip lines 52 made of an electrically conductive material interposed therebetween. The printed circuit board 50 also has upper and lower ground layers 51 formed over substantially the entire front and rear faces thereof (the entire outer faces of the two insulation layers 50a, 50b). The relay contact terminals 11 of the high frequency relays 10 and the internal conductors 31 of the coaxial cables 30 are connected via the strip lines. If a fluorine-contained resin having a small dielectric dissipation factor such, for example, as Teflon is used for the substrate of the printed circuit board 50, not only can the printed circuit board 50 be made thin, but the insertion loss can also be reduced.

The printed circuit board 50 has a plurality of grooves 53 (only one is shown) extending across the thickness thereof and each accommodating the end portion of one of the coaxial cables 30. Each groove 53 has electrically conductive layers 54 formed on opposite inner side walls thereof. The electrically conductive layers 54 are connected to both the upper and lower ground layers 51. The groove 53 has a width substantially equal to the diameter of the external conductor 32 of the coaxial cable 30 and, hence, if the coaxial cable 30 is received in the groove 53, the internal conductor 31 of the coaxial cable 30 is placed on the associated one of the strip lines 52, as best shown in FIG. 13. The electrically conductive layers 54 are formed by plating the inner side walls of the groove 53 with solder so that the electrically conductive layers 54 may be connected to the ground layers 51 on the opposite faces of the printed circuit board 50.

As shown in FIGS. 12 and 13, the printed circuit board 50 has a plurality of generally rectangular recesses 55 (only one is shown) defined therein on one side thereof (on the side of the layer 50*a*) where the connecting portions between the internal conductors 31 of the coaxial cables 30 and the strip lines 52 of the printed circuit board 50 are exposed. Under the condition in which each coaxial cable 30 is received in the associated recess 55, the internal conductor 31 of the former is connected to the associated strip line 52, and the external conductor 32 is connected to the ground layers 51. Thereafter, as shown in FIG. 12, the printed circuit board 50 is covered with another printed circuit board 60 that has a ground layer 61 formed over substantially one entire face thereof so that an opening of the recess 55 may be closed by the printed circuit board 60. The ground layer 61 of the printed circuit board 60 is a conductor connected to the ground layers 51 of the multi-layered printed circuit board 50. The, printed circuit board 60 has a plurality of generally rectangular grooves 62 (only one is shown) defined therein each for accommodating the coaxial cable 30. The ground layer 61 may be formed on the surface of the printed circuit board 60 that is joined to the printed circuit board 50. In this case, the portions of the ground layer 61 that confront the connecting portions between the internal conductors 31 of the coaxial cables 30 and the strip lines 52 of the printed circuit board 50 are removed for prevention of short-circuiting.

The multi-layered construction of the printed circuit board 50 can considerably reduce the insertion loss and allows the positions of the coaxial cables 30 or those of the relay contact terminals 11 relative to the printed circuit board 50 to change. Because of this, all the coaxial cables 30 can have substantially the same length, making it possible to reduce the manufacturing cost thereof. Also, because the electrically conductive layers 54 leading to the ground layers 51 are formed on the inner side walls of each groove 53, the external conductors 32 of the coaxial cables 30 are connected to the ground layers 51 at a reduced distance, enhancing the high frequency characteristics. Furthermore, because the generally rectangular recesses 55 are provided where the connecting portions between the internal conductors 31 of the coaxial cables 30 and the strip lines 52 in the printed circuit board 50 are exposed, the internal conductors 31 can be directly connected to the strip lines 52, making it possible to reduce the insertion loss and shield each strip line 52 from the neighboring strip lines 52. In addition, because the openings of the generally rectangular recesses 55 are covered with the printed circuit board 60 having the ground layer 61, the ground layer 61 acts to enhance the shielding properties, and an insulator of the printed circuit board 60 positioned in the proximity of the strip lines 52 prevents short-circuiting from occurring.

Figure 14:
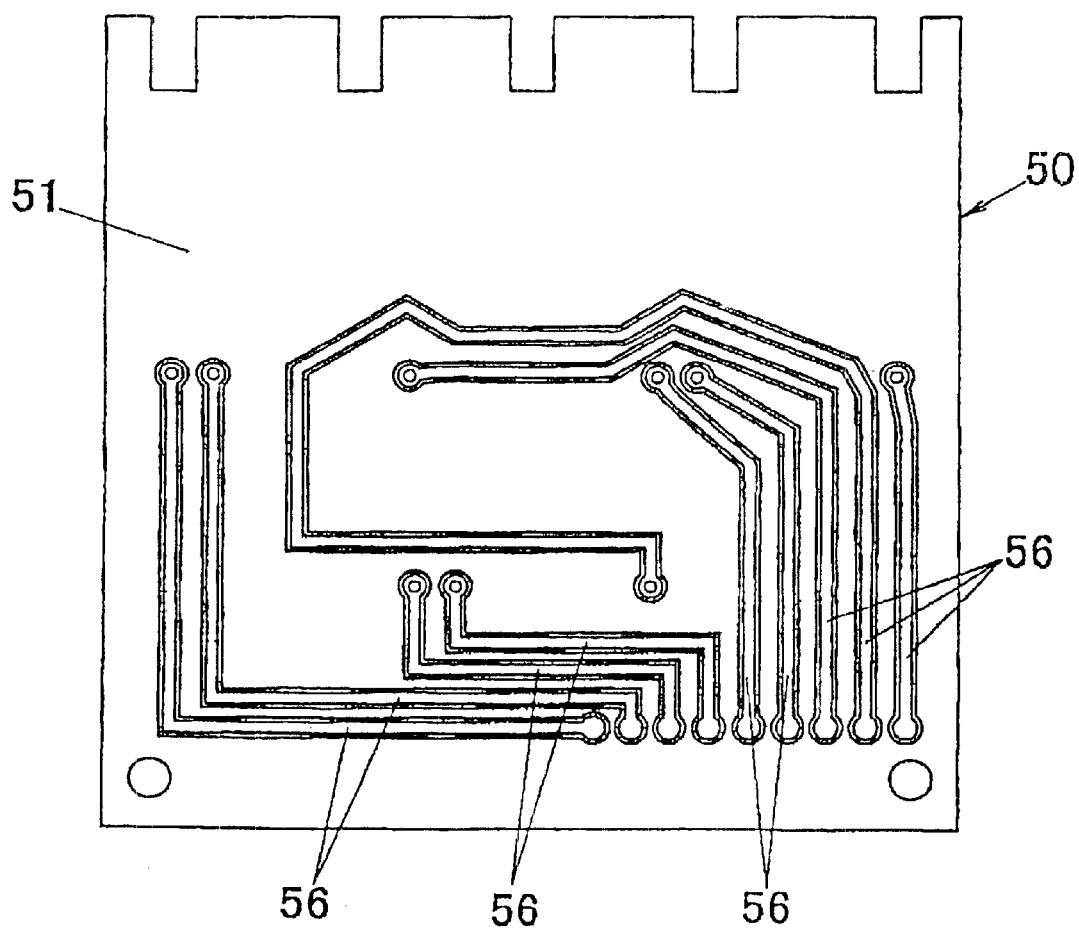
FIG. 14 is a top plan view of a printed circuit board mounted on the high frequency signal switching unit of FIG. 12.

If a wiring pattern 56 for use in connecting terminals (not shown) of the relay connector 40 and the coil terminals 12 of the high frequency relays 10 is formed in one of the ground layers 51, as shown in FIG. 14, the component parts can be reduced in number and in size, compared with the case where the relay connector 40 and the coil terminals 12 of the high frequency relays 10 are connected via the lead wires 41. The wiring pattern for use in connecting the terminals of the relay connector 40 and the coil terminals 12 of the high frequency relays 10 may be formed in the ground layer 61 of the printed circuit board 60. In this case, the possibility of high frequency signals jumping from the strip lines 52 of the multi-layered printed circuit board 50 to the wiring pattern for connecting the relay connector 40 and the coil terminals 12 of the high frequency relays 10 is reduced. As a result, capacitors that have been hitherto used to absorb leakage of the high frequency signals can be dispensed with, making it possible to reduce the number of the component parts and the manufacturing cost.

Figure 15:
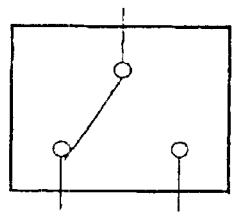
FIG. 15 is a switching circuit diagram of another high frequency signal switching unit.
Figure 16:
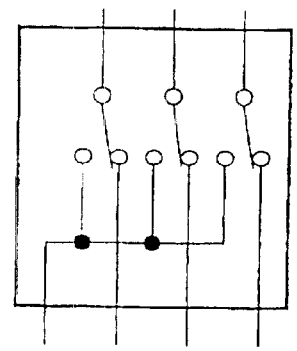
FIG. 16 is a switching circuit diagram of a further high frequency signal switching unit.

Although in the above-described embodiments the high frequency signal switching unit has been described as having a plurality of high frequency relays, it may have only one high frequency relay, as shown in FIG. 15. Furthermore, although in the illustrated embodiments the high frequency signal switching unit has one input terminal and a plurality of output terminals, it may have a plurality of input terminals and a plurality of output terminals, as shown in FIG. 16. The present invention is applicable to high frequency signal switching units having at least one high frequency relay, at least one input terminal, and at least one output terminal.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A high frequency signal switching unit comprising:
   a casing;
   a printed circuit board accommodated in said casing and having a first surface and a second surface opposite to each other, said printed circuit board also having a ground layer formed on substantially the entire first surface;
   at least one input terminal and at least one output terminal both mounted on said casing;
   at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and
   a plurality of coaxial cables accommodated in said casing and having respective internal and external conductors for connecting said input and output terminals to said relay contact terminals of said high frequency relay;
   wherein said grounding terminal of said high frequency relay and said external conductors of said coaxial cables are connected to said ground layer of said printed circuit board, while each of said internal conductors of said coaxial cables is connected to one of said relay contact terminals of said high frequency relay; and
   wherein said printed circuit board has a plurality of recesses defined therein in which end portions of said coaxial cables are respectively received; said recesses having a depth that is determined such that said internal conductors are aligned with the second surface of said printed circuit board.

2. A high frequency signal switching unit comprising:
   a casing;
   a printed circuit board accommodated in said casing and having a first surface and a second surface opposite to each other, said printed circuit board also having a ground layer formed on substantially the entire first surface;

at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of u said relay contact terminals of said high frequency relay, and wherein said printed circuit board has a plurality of grooves defined therein so as to extend across a thickness thereof, in which end portions of said coaxial cables are respectively received, said external conductors of said coaxial cables are directly connected to said ground layer of said printed circuit board along said plurality of grooves.

3. The high frequency signal switching unit according to claim 2, wherein each of said grooves has an electrically conductive layer formed on an inner wall thereof, which is connected to said ground layer of said printed circuit board.

4. The high frequency signal switching unit according to claim 3, wherein said printed circuit board has a plurality of through-holes defined therein, each of which communicates with a neighboring one of said grooves to accommodate one of said relay contact terminals of said high frequency relay, each of said through-holes having an electrically conductive layer formed on an inner wall thereof, which is connected to said ground layer of said printed circuit board.

5. A high frequency signal switching unit comprising:

a casing;

a printed circuit board accommodated in said casing and having a first surface and a second surface opposite to each other, said printed circuit board also having a ground layer formed on substantially the entire first surface;

at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of said relay contact terminals of said high frequency relay;

wherein said printed circuit board has a plurality of recesses defined therein in which end portions of said coaxial cables are respectively received; and wherein each of said internal conductors has a planar free end and a through-hole defined therein, into which one of said relay contact terminals is inserted.

6. A high frequency signal switching unit comprising:

a casing;

a printed circuit board accommodated in said casing and having a first surface and a second surface opposite to each other, said printed circuit board also having a ground layer formed on substantially the entire first surface;

at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of said relay contact terminals of said high frequency relay;

wherein said printed circuit board has a plurality of grooves defined therein so as to extend across a thickness thereof, in which end portions of said coaxial cables are respectively received; and wherein said printed circuit board is a multi-layered construction having two layers formed one upon another with strip lines made of an electrically conductive material interposed therebetween, said printed circuit board also having two ground layers formed on external surfaces of said two layers, respectively, said strip lines connecting said relay contact terminals of said high frequency relay to said internal conductors of said coaxial cables, said external conductors of said coaxial cables are directly connected to said ground layer of said printed circuit board along said plurality of grooves.

7. The high frequency signal switching unit according to claim 6, further comprising a relay connector mounted on said casing for supplying said high frequency relay with electricity, wherein said high frequency relay has coil terminals, and said printed circuit board has a wiring pattern formed in said ground layer for connecting said relay connector to said coil terminals.

8. The high frequency signal switching unit according to claim 6, wherein each of said grooves has an electrically conductive layer formed on an inner wall thereof, which is connected to said two ground layers of said printed circuit board.

9. A high frequency signal switching unit comprising:

a casing;

a printed circuit board accommodated in said casing and having a first surface and a second surface opposite to each other, said printed circuit board also having a ground layer formed on substantially the entire first surface;

at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of said relay contact terminals of said high frequency relay;

wherein said printed circuit board has a plurality of recesses defined therein in which end portions of said coaxial cables are respectively received;

wherein said printed circuit board is of a multi-layered construction having two layers formed one upon another with strip lines made of an electrically conductive material interposed therebetween, said printed circuit board also having two ground layers formed on external surfaces of said two layers, respectively, said strip lines connecting said relay contact terminals of said high frequency relay to said internal conductors of said coaxial cables; and wherein said printed circuit board has a plurality of recesses defined therein on one side thereof where connecting portions between said internal conductors of said coaxial cables and said strip lines are exposed.

10. The high frequency signal switching unit according to claim 9, further comprising a conductor connected to said two ground layers of said printed circuit board, said recesses of said printed circuit board being closed by said conductor.

11. The high frequency signal switching unit according to claim 10, wherein said conductor comprises a ground layer formed on substantially one entire surface of another printed circuit board.

12. The high frequency signal switching unit according to claim 11, further comprising a relay connector mounted on said casing for supplying said high frequency relay with electricity, wherein said high frequency relay has coil terminals, and said another printed circuit board has a wiring pattern formed in said ground layer for connecting said relay connector to said coil terminals.

13. A high frequency signal switching unit comprising:

a casing;

a printed circuit board accommodated in said casing and having a first surface and a second surface opposite to each other, said printed circuit board also having a ground layer formed on substantially the entire first surface; at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of said relay contact terminals of said high frequency relay;

wherein said printed circuit board has a plurality of grooves defined therein so as to extend across a thickness thereof, in which end portions of said coaxial cables are respectively received; and wherein each of said internal conductors has a planar free end and a through-hole defined therein, into which one of said relay contact terminals is inserted.

14. The high frequency signal switching unit according to claim 2, wherein said printed circuit board is of a multi-layered construction having two layers formed one upon another with strip lines made of an electrically conductive material interposed therebetween, said printed circuit board also having two ground layers formed on external surfaces of said two layers, respectively, said strip lines connecting said relay contact terminals of said high frequency relay to said internal conductors of said coaxial cables.

15. The high frequency signal switching unit according to claim 14, further comprising a relay connector mounted on said casing for supplying said high frequency relay with electricity, wherein said high frequency relay has coil terminals, and said printed circuit board has a wiring pattern formed in said ground layer for connecting said relay connector to said coil terminals.

16. The high frequency signal switching unit according to claim 14, wherein said printed circuit board has a plurality of grooves defined therein extending across a thickness thereof, in which end portions of said coaxial cables are respectively received, and wherein each of said grooves has an electrically conductive layer formed on an inner wall thereof, which is connected to said two ground layers of said printed circuit board.

17. The high frequency signal switching unit according to claim 2, wherein said printed circuit board is made of a fluorine-contained resin.

18. A high frequency signal switching unit comprising:

a casing;

a printed circuit board accommodated in said casing and having a first surface and a second surface opposite to each other, said printed circuit board also having a ground layer formed on substantially the entire first surface;

at least one input terminal and at least one output terminal both mounted on said casing;

at least one high frequency relay mounted on said printed circuit board for switching between said input terminal and said output terminal so that a high frequency signal inputted into said input terminal is selectively outputted from said output terminal, said high frequency relay having a plurality of relay contact terminals and a grounding terminal; and a plurality of coaxial cables accommodated in said casing and having respective internal and external conductors for connecting said input and output terminals to said relay contact terminals of said high frequency relay;

wherein said grounding terminal of said high frequency relay and said external conductors of said coaxial cables are connected to said ground layer of said printed circuit board, while each of said internal conductors of said coaxial cables is connected to one of said relay contact terminals of said high frequency relay;

wherein said printed circuit board has a plurality of grooves defined therein so as to extend across a thickness thereof, in which end portions of said coaxial cables are respectively received;

wherein said printed circuit board is of a multi-layered construction having two layers formed one upon another with strip lines made of an electrically conductive material interposed therebetween, said printed circuit board also having two ground layers formed on external surfaces of said two layers, respectively, said strip lines connecting said relay contact terminals of said high frequency relay to said internal conductors of said coaxial cables; and wherein said printed circuit board has a plurality of recesses defined therein on one side thereof where connecting portions between said internal conductors of said coaxial cables and said strip lines are exposed.

19. The high frequency signal switching unit according to claim 18, further comprising a conductor connected to said two ground layers of said printed circuit board, said recesses of said printed circuit board being closed by said conductor.

20. The high frequency signal switching unit according to claim 19, wherein said conductor comprises a ground layer formed on substantially one entire surface of another printed circuit board.

21. The high frequency signal switching unit according to claim 20, further comprising a relay connector mounted on said casing for supplying said high frequency relay with electricity, wherein said high frequency relay has coil terminals, and said another printed circuit board has a wiring pattern formed in said ground layer for connecting said relay connector to said coil terminals.

* * * * *

UNITED STATES PATENT AND TRADEMARK OFFICE
CERTIFICATE OF CORRECTION

PATENT NO. : 6,674,645 B2
DATED : January 6, 2004
INVENTOR(S) : T. Anzai et al.

It is certified that error appears in the above-identified patent and that said Letters Patent is hereby corrected as shown below:

Column 11,
Line 18, after "of" (second occurrence) delete "u".

Column 14,
Line 41, "extending" should be -- so as to extend --.

Signed and Sealed this

Twenty-eighth Day of September, 2004

JON W. DUDAS
*Director of the United States Patent and Trademark Office*